United States Patent
Zipper

(10) Patent No.: US 7,088,968 B2
(45) Date of Patent: Aug. 8, 2006

(54) METHOD AND POLAR-LOOP TRANSMITTER WITH ORIGIN OFFSET FOR ZERO-CROSSING SIGNALS

(75) Inventor: Eliav Zipper, Tel-Aviv (IL)

(73) Assignee: Intel Corporation, Santa Clara, CA (US)

( * ) Notice: Subject to any disclaimer, the term of this patent is extended or adjusted under 35 U.S.C. 154(b) by 1072 days.

(21) Appl. No.: 10/020,423

(22) Filed: Dec. 12, 2001

(65) Prior Publication Data

US 2003/0109240 A1    Jun. 12, 2003

(51) Int. Cl.
*H04B 1/04* (2006.01)
(52) U.S. Cl. .................. 455/126; 455/91; 455/260
(58) Field of Classification Search ............... 455/126, 455/91, 106, 108, 109, 110, 86, 87, 200, 255, 455/262, 264; 370/205, 347; 331/2, 25; 327/156; 332/145, 151
See application file for complete search history.

(56) References Cited

U.S. PATENT DOCUMENTS

| | | | |
|---|---|---|---|
| 4,630,315 A | 12/1986 | Watkinson | ................... 455/109 |
| 5,105,168 A * | 4/1992 | DaSilva | .......................... 331/2 |
| 5,898,906 A | 4/1999 | Williams | ...................... 455/75 |
| 6,047,168 A | 4/2000 | Carlsson et al. | ............ 455/126 |
| 6,853,836 B1 * | 2/2005 | Asam et al. | ................. 455/126 |

FOREIGN PATENT DOCUMENTS

GB    2135546 A  *  8/1984
WO    95/23453       8/1995

* cited by examiner

*Primary Examiner*—Melur Ramakrishnaiah
(74) *Attorney, Agent, or Firm*—Schwegman, Lundberg, Woessner & Kluth, P.A.

(57) ABSTRACT

A transmitter synthesizes a signal having a phase modulated component and an amplitude modulated component. Phase and amplitude reference signals are generated from phase and amplitude information extracted from an offset output and offset input signal. An origin-offset signal source generates a compensation signal which is combined with the input and output signals to generate the offset input and output signals.

24 Claims, 2 Drawing Sheets

METHOD AND POLAR-LOOP TRANSMITTER WITH ORIGIN OFFSET FOR ZERO-CROSSING SIGNALS

FIELD OF THE INVENTION

The present invention pertains to transmitters, and in particular, pertains to modulating and amplifying an information signal for further transmission through a radio channel.

BACKGROUND OF THE INVENTION

In a communication system, before a signal is modulated onto a carrier wave having an intermediate frequency, it is referred to as a baseband signal. In a transmitter, the baseband signal may be split into I and Q components that make up a vector defining the information signal. The I and Q components are modulated onto a carrier wave using a modulator and the output is up-converted using one or more frequency mixers. The carrier wave includes the amplitude and phase components of the modulating signal. Because the modulator operates at relatively low power levels compared to the transmitted power level, amplification between the modulator and the antenna is necessary. This amplification should be linear and efficient. Non-linear amplification creates distortion that may cause, among other things, error in the information vector. In a worst case, distortion may cause broadening of the frequency spectrum of the transmitted signal. Broadening of the frequency spectrum may interfere with nearby channels and may reduce traffic capacity. It may also result in the consumption of additional power reducing the efficiency of the transmitter which is undesirable, especially for mobile communication devices.

Linear amplifiers have been used to help improve the linearity of the output signals, but their efficiency is too low to be a practical alternative to non-linear power amplifiers, especially for mobile communication devices. Pre-distortion of the I and Q components is another technique that has been used to improve linearity but it is difficult to implement and it's application is limited. Cartesian feedback is another technique used for improving linearity, however this technique requires exact phase matching at the power amplifier output.

Polar-loop transmitters have also been used to help reduce spectrum broadening and improve power amplifier linearity. In a conventional polar-loop transmitter, an information signal is split into its polar components which consist of a phase reference component and an amplitude reference component. The components are processed in separate control loops and recombined to produce an output signal. One problem with conventional polar-loop transmitters is that modem communication techniques introduce modulation schemes, including for example, Code Division Multiple Access (CDMA) and Wideband (CDMA) schemes, where the instant signal trajectory may cross the zero point on a phasor diagram. This zero-crossing trajectory creates several difficulties for conventional polar-loop transmitters. For example, a zero-crossing trajectory has a phase component discontinuity similar to a step-function that results from the instantaneous transition of the phase by 180 degrees. The amplitude component at this zero-crossing occurrence may also contain a time derivative discontinuity. Because of the zero crossing, both the amplitude and phase components become very wideband making the processing of these components sensitive to bandwidth and slew-rate limitations.

Another problem with conventional polar-loop transmitters is the processing of the phase component by a phase detector. A phase detector's transfer function typically depends on the amplitude of the incoming signal, and amplitude regulating circuitry removes the amplitude modulation component. The amplitude regulating circuitry, such as a limiter or an automatic level control (ALC) circuit, has a limited range of functionality and has difficulty handling zero-crossing trajectories.

Thus there is a general need for an improved transmitter and method for transmission of signals. There is also a need for a transmitter and method for transmission of signals with improved efficiency. There is also a need for a transmitter and method for transmission of signals that helps reduce the broadening of the frequency spectrum. There is also a need for a transmitter and method for transmission of signals that helps increase the efficiency of a transmitter's non-linear amplifier. There is also a need for a transmitter and method for transmission of signals with improved linearity. There is also a need for an improved polar-loop transmitter and method that handles zero-crossing trajectories.

BRIEF DESCRIPTION OF THE DRAWINGS

The invention is pointed out with particularity in the appended claims. However, a more complete understanding of the present invention may be derived by referring to the detailed description when considered in connection with the figures, wherein like reference numbers refer to similar items throughout the figures and:

DETAILED DESCRIPTION

The description set out herein illustrates the various embodiments of the invention and such description is not intended to be construed as limiting in any manner. The present invention relates to transmitters, and in one embodiment, relates to polar-loop transmitters. In other embodiments, the present invention relates to transmitters for code division multiple-access (CDMA) signals including wideband CDMA (WCDMA) signals.

Figure 1:
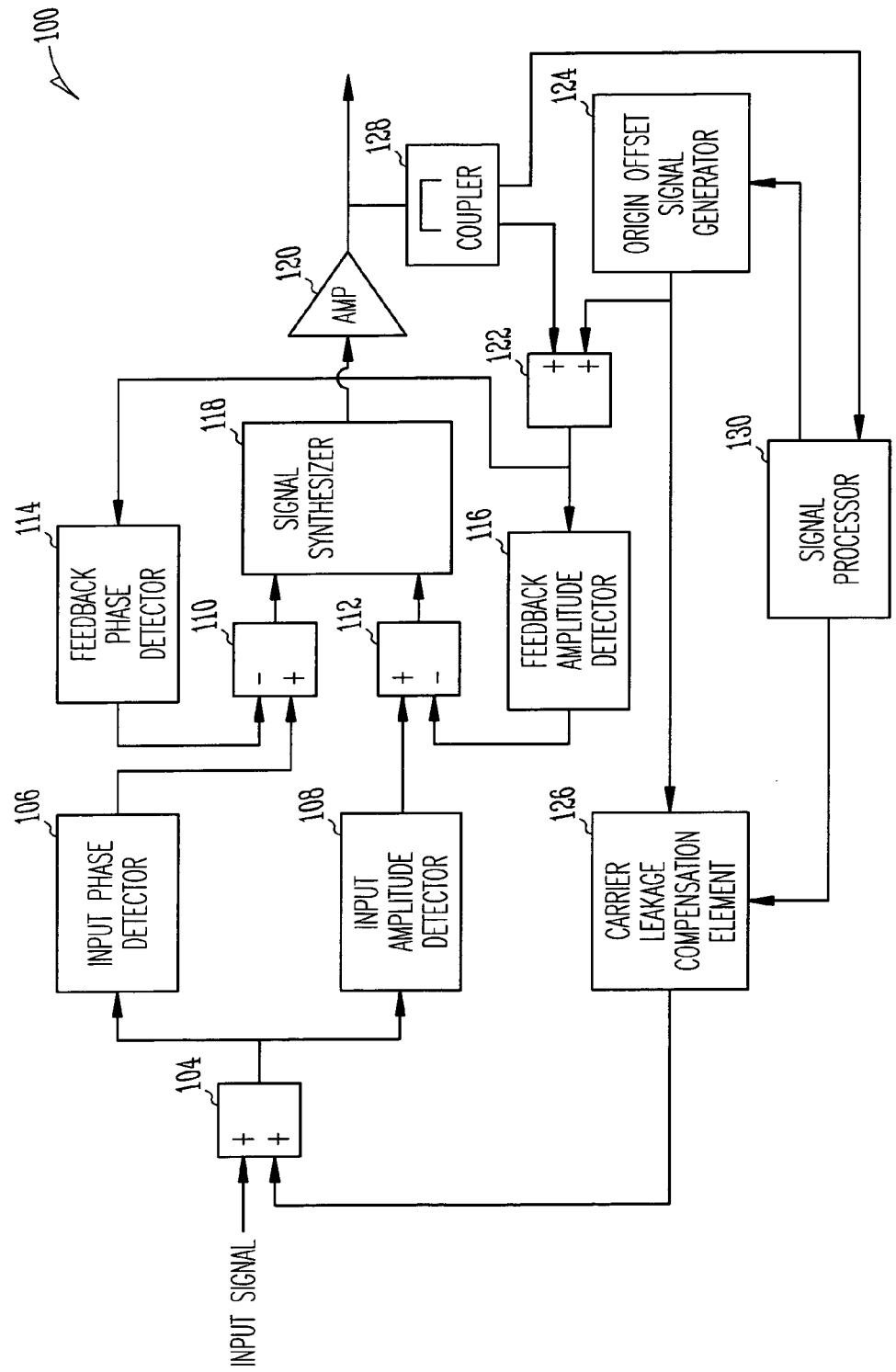
FIG. 1 is a functional block diagram of a transmitter in accordance with an embodiment of the present invention.

FIG. 1 is a functional block diagram of a transmitter in accordance with an embodiment of the present invention. Transmitter 100 receives a complex input signal from a signal source. The complex input signal may be a baseband information signal and may be at, for example, an intermediate frequency (IF). The baseband signal, for example, may be comprised of I and Q components or may be comprised of amplitude and phase components. The complex input signal is combined with a compensated origin offset complex signal in input combining element 104 to generate an offset input signal. Input phase detector 106 extracts the phase information from the offset input signal and input amplitude detector 108 extracts the amplitude information from the offset input signal. Phase difference element 110 generates a phase reference signal from phase information extracted by phase detector 106 and an offset output signal. Amplitude difference element 112 generates an amplitude reference signal from amplitude information extracted by amplitude detector 108 and the offset output signal. Signal synthesizer 118 generates an output signal from the amplitude reference signal and the phase reference signal provided by elements 112 and 110 respectively. Elements 112 and 110 may include gain and/or filtering functionality and, for example, may include a filter and/or amplifier to process either the amplitude difference or phase difference.

The output signal from signal synthesizer 118 may be amplified by non-linear amplifier 120 to produce an output signal of the transmitter. The amplified output signal is sampled by coupling element 128. Coupling element 128 may be a signal coupler or other element that couples the output signal. Output combining element 122 combines the sampled/coupled output signal with an origin-offset signal to generate the offset output signal. Feedback phase detector 114 extracts phase information from the offset output signal, and feedback amplitude detector 116 extracts amplitude information from the offset output signal. Feedback phase detector 114 may be a composite phase detector that detects the phase difference between two periodic signals. Origin-offset signal generator 124 generates the origin-offset signal, which may be an RF signal. The origin-offset signal may be a sine wave at the output frequency and may contain, for example harmonics. The origin-offset signal may also be a square wave or other signal with proper filtering. Carrier leakage compensation element 124 may compensate the origin-offset signal for any origin mismatch.

In one embodiment, signal synthesizer 118 may synthesize an output signal at the same frequency as the input signal. For example, both the input and the output signals may be IF frequencies. In another embodiment, signal synthesizer 118 may synthesize an output signal having a different frequency than the input signal. For example, the input signal may be an IF signal and signal synthesizer 118 may synthesize an RF or other higher frequency signal. In this embodiment, element 126 may also include functionality to down-convert the origin-offset signal to the frequency of the input signal. Alternatively, carrier leakage compensation element 126 may be implemented within a digital signal processor which adds the origin-offset signal directly to the input signal. A live adaptation process may be used to correlate between the output and input origin offset. Signal synthesizer 118 may also synthesize an output signal having a different amplitude than the input signal and an attenuator may be included to help equalize the average amplitude of the feedback signal.

Transmitter 100 may also include signal processor 130 which, among other things, may control the amplitude and phase components of the origin-offset signal generated by origin offset generator 124. Signal processor 130 may also control an amount of compensation of the origin-offset signal by carrier leakage compensation element 126. Signal processor 130 may be implemented as part of a digital signal processor (DSP) and may be configured with software and firmware. Although signal processor 130 is illustrated in FIG. 1 as a separate functional element, other functional elements of transmitter 100 may also be implemented as part of a DSP. For example, a portion of carrier leakage compensation element 126 and portions of origin-offset signal generator 124 may also be implemented as part of the signal processor 130. In one embodiment, detectors 106, 108, 114 and 116, signal synthesizer 118, and elements 110 and 112 may also be implemented within one or more DSPs.

Transmitter 100 helps reduce and even may eliminate the difficulties associated with zero-crossings of a conventional polar-loop transmitter by shifting the origin of the complex signal away from the true origin. Because the origin shifting signal is provided at both the input to the control loop and in the feedback branch, the output is not origin-shifted. Mismatch in the origin shift may lead to carrier leakage at the output signal, however compensation may also be provided by carrier leakage compensation element 126.

Signal processor 130 among other things, may control the amplitude and phase components of the origin-offset signal generated by origin offset generator 124. The control of the origin-offset signal may be based on the output signal from coupling element 128 and may be set to shift the signal trajectory away from zero on the phasor plane. For example, it may be set with an angle of 45 degrees or greater to avoid a zero-crossing. The proportion of the origin-offset signal to the output signal may be a predetermined number, and may be adapted to output levels proportionally. The transmitted signal may also be down-converted and the carrier leakage may be detected as a DC component.

Signal processor 130 may also control an amount of compensation of the origin-offset signal by carrier leakage compensation element 126. For example, signal processor 130 may adjust the amplitude and phase of the compensation signal provided by element 126 based on the transmitted signal. In one embodiment, a ratio of RMS level to average levels of the output signal amplitude may be used to determine an appropriate carrier leakage compensation level to help compensate for origin mismatch.

The relative amplitude and phase may be substantially matched on the forward and feedback paths. In one embodiment, the relative level of the amplitude and amount of phase may be adapted by signal processor 130 based on feedback, for example, when higher accuracy is desired.

Non-linear amplifier 120 may be any non-linear amplifier including RF or microwave power amplifiers or other non-linear amplifiers specific to the application of transmitter 100. Phase detectors 106 and 114 may, for example, comprise phase locked loops, and amplitude detectors 108 and 116 may be envelope detectors. Signal synthesizer 118 may include components such as a voltage controller oscillator (VCO) and amplitude modulator to synthesize an output signal from phase and amplitude reference signals. Combining elements 104 and 122 may be signal combiners. In one embodiment, combining elements 104 and 122 may be implemented as part of a DSP in which the combining may be accomplished by current summation.

Transmitter 100 may be used for modulating and amplifying an information signal for further transmission through a radio channel. In one or more embodiments, transmitter 100 may be implemented as part of a mobile or wireless communication device, such as wireless telephone. In another embodiment, transmitter 100 may be implemented as part of communication base stations for providing wireless communications to wireless communication devices. In other embodiments, transmitter 100 may serve as a transmitter in a hybrid-fiber-coax (HFC) communication system, a cable television system, or a satellite communication system. In one embodiment, transmitter 100 may implement one or more of many communication techniques including, for example, time-division multiple-access (TDMA) communications, frequency-division multiple-access communications (FDMA), code-division multiple-access communications (CDMA), wideband code-division multiple-access communications (WCDMA), and combinations thereof.

In one embodiment, the present invention may provide a digital signal processor (DSP). The DSP may include a phase difference block to generate a phase reference signal from phase information extracted from an offset input signal and an offset output signal. The DSP may also include an amplitude difference block to generate an amplitude reference signal from amplitude information extracted from the offset input signal and the offset output signal. The DSP may also include a signal synthesizer block to synthesize an output signal from the amplitude reference signal and the phase reference signal. The DSP may also include an input-combining block to add an input signal with an origin-offset signal to produce the offset input signal. The DSP may also include a carrier leakage compensation block to adjust at least one of an amplitude and phase of the origin-offset signal based on a carrier leakage level of the output signal to provide a compensated origin-offset signal to the input-combining block.

Figure 2:
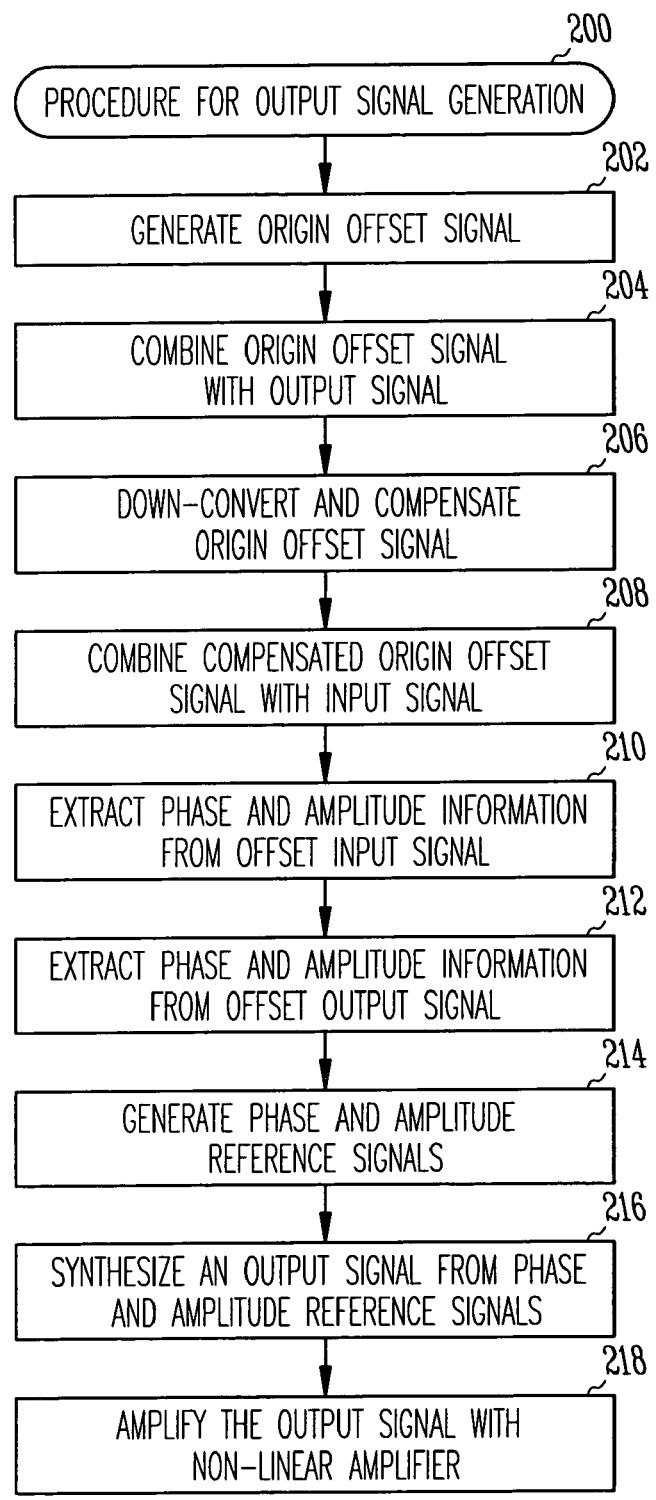
FIG. 2 is a flow chart of an output signal transmission procedure in accordance with an embodiment of the present invention.

FIG. 2 is a flow chart of an output signal generation procedure in accordance with an embodiment of the present invention. Although the individual operations of procedure 200 are illustrated and described as separate operations, it should be noted that one or more of the individual operations may be performed concurrently. Further, nothing necessarily requires that the operations be performed in the order illustrated. Transmitter 100 (FIG. 1) is an example of a transmitter suitable for use in performing procedure 200, however other transmitter configurations may also be suitable.

Operation 202 generates an origin-offset signal and operation 204 combines the origin-offset signal with a sampled output signal to produce an offset output signal. Operation 206 compensates the origin-offset signal for any mismatch in the origin shift. In one embodiment, operation 206 may down-convert the origin-offset signal from an RF to an IF frequency. Operation 208 combines the origin-offset signal, which may have been compensated in operation 206, with an input signal to produce an offset input signal. Operation 210 extracts phase and amplitude information from the offset input signal. Operation 212 extracts phase and amplitude information from the offset output signal. Operation 214 generates phase and amplitude reference signals from, respectively, the phase and amplitude information extracted from the offset input signal and offset output signal. Operation 216 synthesizes an output signal from the phase and amplitude reference signals, and operation 218 amplifies the output signal with a non-linear amplifier. The non-linearly amplified signal produced in operation 218 may be the signal that is sampled or coupled as part of operation 204 and combined with the origin-offset signal.

Thus, an improved transmitter and method of generating an output signal have been described. In one embodiment, the transmitter and method may help improve efficiency of a transmitter's non-linear amplifier, and may help utilize the higher efficiency regions of the non-linear amplifier. In another embodiment, the transmitter and method may help reduce the broadening of the frequency spectrum. In another embodiment, the transmitter and method may generate an output signal with improved linearity.

The foregoing description of the specific embodiments reveals the general nature of the invention sufficiently that others can, by applying current knowledge, readily modify and/or adapt it for various applications without departing from the generic concept, and therefore such adaptations and modifications are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A transmitter comprising:
   a phase difference element to generate a phase reference signal from phase information extracted from an offset input signal and an offset output signal;
   an amplitude difference element to generate an amplitude reference signal from amplitude information extracted from the offset input signal and the offset output signal;
   a signal synthesizer to synthesize an output signal from the amplitude reference signal and the phase reference signal;
   an input combining element to combine an input signal with an origin-offset signal to produce the offset input signal; and
   an output combining element to combine the output signal and the origin-offset signal to produce the offset output signal.

2. The transmitter of claim 1 further comprising a carrier leakage compensation element to adjust an amplitude and phase of the origin-offset signal based on a carrier leakage level of the output signal to provide a compensated origin-offset signal to the input combining element.

3. The transmitter of claim 2 wherein the carrier leakage compensation element adjusts the origin-offset signal either based on a ratio of an RMS level and an average level of the output signal or based on detection of carrier leakage in a non-linearly amplified output signal.

4. The transmitter of claim 2 wherein the input signal is a baseband signal and wherein the carrier leakage compensation element is implemented within a digital signal processor and adds the origin-offset signal directly to the input signal.

5. The transmitter of claim 1 further comprising:
   an input phase detector to extract phase information from the offset input signal;
   an input amplitude detector to extract amplitude information from the offset input signal;
   a feedback phase detector to extract phase information from the offset output signal; and
   a feedback amplitude detector to extract amplitude information from the offset output signal.

6. The transmitter of claim 1 further comprising an origin-offset signal generator to generate the compensation signal.

7. The transmitter of claim 6 wherein the origin-offset signal includes a frequency of the output signal to cause a shift in the phase of the phase reference signal away from zero on a phasor plane.

8. The transmitter of claim 7 wherein the origin-offset signal generator adjusts an amplitude and phase of the origin-offset signal based on a non-linearly amplified output signal.

9. The transmitter of claim 1 further comprising an output amplifier to amplify the output signal generated by the signal synthesizer prior to being combined by the output combining element.

10. The transmitter of claim 7 wherein the output amplifier is a non-linear power amplifier.

11. The transmitter of claim 1 wherein the output signal is one of a plurality of frequency channels in a WCDMA communication system.

12. The transmitter of claim 5 wherein at least one of the phase and amplitude difference elements, the signal synthesizer, the feedback phase and amplitude detectors and the input phase and amplitude detectors are fabricated as part of a digital signal processor (DSP).

13. A wireless communication device comprising:
a phase difference element to generate a phase reference signal from phase information extracted from an offset input signal and an offset output signal;
an amplitude difference element to generate an amplitude reference signal from amplitude information extracted from the offset input signal and the offset output signal;
a signal synthesizer to generate an output signal from the amplitude reference signal and the phase reference signal;
an input combining element to combine an input signal with a compensation signal to generate the offset input signal;
an output combining element to combine the output signal and the compensation signal to generate the offset output signal;
a non-linear power amplifier to amplify the output signal generated by the signal synthesizer prior to being combined by the output combining element; and
an origin-offset signal source generator to generate the compensation signal.

14. The communication device of claim 13 further comprising a carrier leakage compensation element to down-convert the compensation signal from a radio frequency (RF) to an intermediate frequency (IF), and wherein the input combining element combines the input signal with the IF compensation signal to generate the offset input signal.

15. The communication device of claim 13 wherein the origin-offset signal source generator generates the compensation signal at a frequency of the output signal.

16. A method of generating an output signal comprising:
generating a phase reference signal from phase information extracted from an offset input signal and an offset output signal;
generating an amplitude reference signal from amplitude information extracted from the offset input signal and the offset output signal;
generating an output signal from the amplitude reference signal and the phase reference signal;
combining an input signal with a compensation signal to generate the offset input signal; and
generating the output signal and the compensation signal to generate the offset output signal.

17. The method of claim 16 further comprising adding the compensation signal directly to the input signal in a digital signal processor to generate the offset input signal.

18. The method of claim 16 further comprising:
extracting phase information from the offset input signal; and
extracting amplitude information from the offset input signal.

19. The method of claim 16 further comprising:
extracting phase information from the offset output signal; and
extracting amplitude information from the offset output signal.

20. The method of claim 16 further comprising generating the compensation signal at a frequency of the output signal.

21. The method of claim 16 further comprising amplifying the output signal generated by the signal synthesizer with a non-linear power amplifier prior to combining the output signal with the compensation signal.

22. A digital signal processor (DSP) comprising:
a phase difference block to generate a phase reference signal from phase information extracted from an offset input signal and an offset output signal;
an amplitude difference block to generate an amplitude reference signal from amplitude information extracted from the offset input signal and the offset output signal;
a signal synthesizer block to synthesize an output signal from the amplitude reference signal and the phase reference signal; and
an input-combining block to add an input signal with an origin-offset signal to produce the offset input signal.

23. The DSP of claim 22 further comprising a carrier leakage compensation block to adjust an amplitude and phase of the origin-offset signal based on a carrier leakage level of the output signal to provide a compensated origin-offset signal to the input-combining block, the carrier leakage compensation block adjusting the origin-offset signal based on a ratio of an RMS level and an average level of the output signal.

24. The DSP of claim 23 wherein the output signal is coupled external to the DSP and combined with the origin-offset signal to produce the offset output signal.

* * * * *

UNITED STATES PATENT AND TRADEMARK OFFICE
CERTIFICATE OF CORRECTION

| | |
|---|---|
| PATENT NO. | : 7,088,968 B2 |
| APPLICATION NO. | : 10/020423 |
| DATED | : August 8, 2006 |
| INVENTOR(S) | : Zipper |

Page 1 of 1

It is certified that error appears in the above-identified patent and that said Letters Patent is hereby corrected as shown below:

Title page, in field (56), under "Foreign Patent Documents", in column 2, line 1, after "8/1984" insert -- H03C 01/06 --.

Title page, in field (56), under "Foreign Patent Documents", in column 2, line 2, after "8/1995" insert -- H03C 1/00 --.

Signed and Sealed this

Fifth Day of December, 2006

JON W. DUDAS
*Director of the United States Patent and Trademark Office*